United States Patent [19]

Ablassmeier

[11] Patent Number: 4,942,444
[45] Date of Patent: Jul. 17, 1990

[54] THYRISTOR

[75] Inventor: Ulrich Ablassmeier, Waltenhofen, Fed. Rep. of Germany

[73] Assignee: Siemens Aktiengesellschaft, Berlin and Munich, Fed. Rep. of Germany

[21] Appl. No.: 48,603

[22] Filed: Jun. 14, 1979

[30] Foreign Application Priority Data

Aug. 10, 1978 [DE] Fed. Rep. of Germany ....... 2835089

[51] Int. Cl.$^5$ ............................................. H01L 29/74
[52] U.S. Cl. .................................... 357/38; 357/23.4; 357/43; 357/86
[58] Field of Search ........................ 357/23, 38, 86, 15, 357/35, 43, 44, 41

[56] References Cited

U.S. PATENT DOCUMENTS

| 3,831,187 | 8/1974 | Neilson | 357/38 |
| 3,972,061 | 7/1976 | Nelson | 357/38 |
| 4,137,545 | 1/1979 | Becke | 357/38 |
| 4,145,700 | 3/1979 | Sambotkar | 387/41 |

FOREIGN PATENT DOCUMENTS

| 2040657 | 2/1972 | Fed. Rep. of Germany | 357/38 |
| 2410721 | 9/1974 | Fed. Rep. of Germany | 357/38 |
| 51-85381 | 7/1976 | Japan | 357/23.4 |
| 341378 | 7/1977 | U.S.S.R. | 357/38 |

Primary Examiner—Joseph E. Clawson, Jr.
Attorney, Agent, or Firm—Hill, Van Santen, Steadman & Simpson

[57] ABSTRACT

The invention herein disclosed relates to a thyristor of the MOS control type. The thyristor has a series of semiconductor layers of varying conductibility types lying above one another in which the semiconductor layers lying at the ends of the series are provided with end-side electrodes and in which a part of the surface of the next-to-the-last layer not covered by the last layer is charged with a control voltage supplied via a control terminal. A power-saving control is obtained in thyristors of this type. This objective is attained in that a region of the surface of the next-to-the-last layer not covered by the last layer is covered with a thin, insulating layer on which a gate connected with a control terminal is arranged. Next to the edge of the last layer, a zone exhibiting the same conductibility type as this last layer is formed which completely penetrates the next-to-the-last layer.

2 Claims, 2 Drawing Sheets

THYRISTOR

BACKGROUND OF THE INVENTION

The invention relates to a thyristor, and more particularly to one having a MOS type control.

Many types of thyristors have been described in the past. See, for example, in the book by R. Muller "Bauelemente der Halbleiter-Elektronik", Springer-Verlag, Berlin 1973, on pages 173 and 174, particularly FIG. 197.

In known thyristors of this type, the control electrode is in immediate contact with the next-to-the-last semiconductor layer. Because of this, such a low input resistance ensues at the control electrode that control currents of 10 mA or more must be supplied in order to achieve a triggering of the thyristor.

BRIEF SUMMARY OF THE INVENTION

The object of the invention is to improve thyristors in such a manner that they can be triggered with the lowest possible driving powers. This is achieved according to the present invention by means hereafter to be described.

The advantage which can be attained with the invention lies particularly in the fact that a simply constructed component element suitable for the switching of large outputs ensues which is triggered with particularly low driving powers.

A five triac structure which is constructed of two DMOS transistors with a common drain area integrated in a semiconductor layer is known from the periodical "Electronic Design" of Feb. 15, 1978 (Volume 4), pages 32ff. The diffused channel zones of both transistors are covered with gate oxide areas over which a common control gate is placed. Whereas the common drain area exhibits no external connection, the source area and the diffused channel zone of the one transistor are respectively provided with a cathode connection, the source area and the diffused channel zone of the other thyristor are respectively provided with an anode connection. In the control of the triac via the common control gate arranged insulated, a driving power of only a few pW is required. In the case of this structure, however, it is a matter of a structure functionally integrated out of a plurality of component elements provided with a complicated drive, which is not comparable with a thyristor according to the invention.

BRIEF DESCRIPTION OF THE DRAWINGS

The invention is explained in greater detail with reference to the drawing, in which.

DESCRIPTION OF THE PREFERRED EMBODIMENTS

Figure 1:
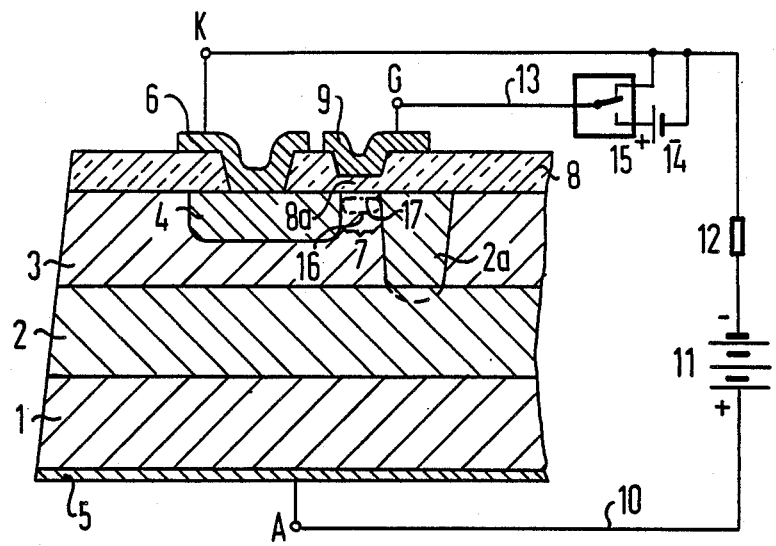
FIG. 1 shows a first preferred embodiment of an n-channel thyristor according to the invention.

FIG. 1 illustrates a semiconductor structure with four semiconductor layers 1 through 4 lying above one another of alternate conductivity type which respectively consist of p+, n− and and n+ doped semiconductor material, for example, silicon. The layer 1 is contacted by a large-surface, end-side electrode 5 which represents the anode of the thyristor and is provided with the terminal A. The layer 4 is contacted with an end-side electrode 6 which represents the cathode of the thyristor and is connected with a terminal K. The layer 4 does not cover a part of the surface of the next layer 3, which part is referenced 7. This part 7 is covered with a thin, electrical insulating layer 8a on which a gate 9 is arranged which is connected with a control terminal G. At the interval of a channel length of a field effect transistor, an n-doped zone 2a is provided next to the right-hand edge of layer 4, exhibiting the same conductivity type as layer 4, which zone 2a penetrates layer 3 from its interface opposite an insulation layer 8 covering the four-layer structure to its interface opposite the layer 2.

A circuit 10 includes a voltage source 11 and a load resistor 12 is connected to the terminals A and K. Thereby, the positive pole of the voltage source is connected with the terminal A. A control current circuit wired to the terminals K and G includes a control voltage source 14 and a change-over switch 15.

When a positive control voltage supplied by 14 and lying above the value of the operating voltage is supplied to the terminal G via the change-over switch 15 in the switching position which is not illustrated, then a space charge region 16 arises in layer 3, within which space charge zone an inversion surface barrier 17 is formed on the interface to the insulation layer 8a. According to the construction of this inversion surface barrier representing an n-conductive channel between the layer 4 and the zone 2a and, thus, the layer 2, the thyristor triggers and the current flowing between the electrodes A and K completes the circuit 10. Upon the opening of the change-over switch 15 into its illustrated switching position, this current remains. Only when the current falls below a relatively small holding value is the thyristor blocked and the circuit 10 again interrupted. The triggering of the thyristor described above ensues according to the principle of enhancement of the marginal zone of layer 3 with negative, mobile charge carriers.

In case the insulation layer 8a exhibits positive interface charges in the area of its interface with the layer 3, space charge zones 16 and the inversion surface barrier 17 arises in the illustrated position of the change-over switch 15, in which G lies at the potential of K. If, upon pole reversal of the illustrated voltage source 14, a negative control voltage is supplied via the change-over switch 15 in its non-illustrated switching position to the terminal G, then the effect of the interface charges is negated and the construction of the space charge zone 16 and of the inversion surface barrier 17 is prevented so that the thyristor cannot trigger. Only when the switch 15 is switched over and the control voltage is switched off from G, does the triggering occur. Thereby, one can speak of a triggering according to the principle of charge carrier depletion in which the charge carrier density of an inversion surface barrier existing without the applied control voltage being strongly reduced by means of the switching-on of the control voltage.

Figure 2:
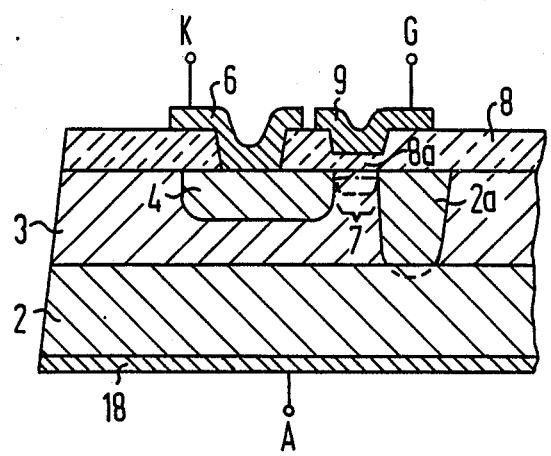
FIG. 2 shows a second preferred embodiment of an n-channel thyristor.

FIG. 2 illustrates a further sample embodiment of an n-channel thyristor according to the invention in which one has proceeded from a three-layer semiconductor structure 2, 3, 4. Thereby, the parts already described on the basis of FIG. 1 are provided with the same reference symbols. The n-doped semiconductor layer 2 is provided with an end-side, large-surface metal coating 18 which forms a Schottky diode together with it. Such diodes are described, for example, in the book by R. Muller "Bauelemente der Halbleiter-Elektronik", Springer-Verlag, Berlin 1973 on pages 36 through 41. Aluminum which is provided with an additive of 1.5 weight percent silicon is expediently employed as the material for the coating 18. The coating 18 is connected with the terminal A. The manner of functioning of the thyristor according to FIG. 2 corresponds to that already described on the basis of FIG. 1.

Figure 3:
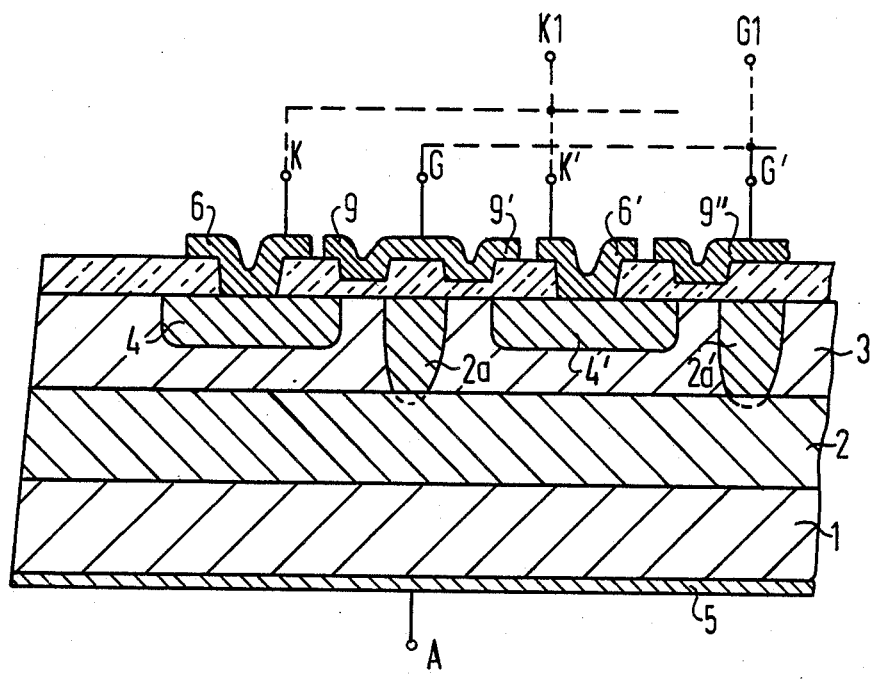
FIG. 3 shows the common arrangement of a plurality of thyristors according to FIG. 1 in a monolithically integrated form.

FIG. 3 first shows two thyristors of the type illustrated in FIG. 1 in a monolithically integrated form. Thereby, the parts of the first thyristor described in FIG. 1 are provided with the same reference symbols as above. The second thyristor is situated to the right next to the first, whereby the semiconductor layers 1 through 3, the zone 2a and the electrode 5 are common to both thyristors. The fourth semiconductor layer of the second thyristor is designated with 4', its cathode with 6' and the cathode terminal with K'.

The gate 9 of the first thyristor is extended so far that it renders possible the simultaneous control of the second thyristor with its part 9'.

As is further indicated in FIG. 3, an entire series of thyristors can be monolithically integrated in an extension of this principle, whereby the next thyristor connecting to the right consists of the parts K', 6', G', 9'', 4', 2a', 3, 2, 1, 5 and A. Thereby, it is expedient to connect the electrodes K, K', etc. of all thyristors of this series with a common cathode terminal K1 and to conduct the gate electrodes G, G' of all thyristors of this series to a common gate terminal G1.

Likewise, two or more thyristors designed according to FIG. 2 can be realized in a monolithically integrated form corresponding to FIG. 3. Thereby, the semiconductor layer 1 and the electrode 5 in FIG. 3 are then replaced by a large-surface, metal coating of layer 2, which forms a Schottky diode together with this.

It will be apparent to those skilled in the art that many modifications and variations may be effected without departing from the spirit and scope of the novel concepts of the present invention.

I claim as my invention:

1. A plurality of integrated thyristors, comprising:
   common body section formed from a series of first, second, and third stacked semiconductor layers of alternate conductivity types with an anode electrode affixed to the first layer at a first end thereof;
   a plurality of spaced apart cathode regions formed in the third semiconductor layer at the opposite end of the body adjacent the exterior surface thereof;
   each said cathode region has a cathode electrode affixed thereto and has a conductivity type opposite that of said third semiconductor layer;
   an insulating layer covering the remaining exterior surface of said third semiconductor layer;
   a plurality of spaced apart additional regions, each said additional region being formed in said third semiconductor layer adjacent a corresponding cathode region and at a distance therefrom corresponding to a channel length of a field effect transistor, each said additional region extending through said third semiconductor layer to the next layer and each said additional region having the same conductivity type as does each said cathode region;
   each said gate region having a gate electrode on said insulating layer positioned adjacent a corresponding cathode electrode and substantially between said gate region and said associated cathode region; and
   adjacent gate regions having their respective gate electrodes as a common gate electrode comprising a continuous metal layer running above and over the additional region between the adjacent gate regions.

2. A plurality of integrated thyristors, comprising:
   a common body section formed from a series of first, second, and third stacked semiconductor layers of alternate conductivity types with an anode electrode affixed to the first layer at a first end thereof;
   at least first and second spaced apart cathode regions formed in the third semiconductor layer at the opposite end of the body adjacent the exterior surface thereof;
   the first and second cathode regions each having a cathode electrode affixed thereto and having a conductivity type opposite that of said third semiconductor layer;
   an insulating layer covering the remaining exterior surface of said third semiconductor layer;
   at least one additional region between the first and second cathode regions formed in said third semiconductor layer and at a distance from each of the first and second cathode regions corresponding to a channel length of a field effect transistor, said additional region extending through said third semiconductor layer to the next layer and the additional region having the same conductivity type as the first and second cathode regions;
   the two gate regions each having a respective gate electrode on said insulating layer positioned adjacent a corresponding cathode electrode and substantially between said gate region and said associated cathode region; and
   the gate electrodes of the two gate regions being formed as a common gate electrode comprising a continuous metal layer running above and over the additional region between the two gate regions.

* * * * *